United States Patent [19]

Andrews et al.

[11] Patent Number: 4,837,775

[45] Date of Patent: Jun. 6, 1989

[54] ELECTRO-OPTIC DEVICE HAVING A LATERALLY VARYING REGION

[75] Inventors: James T. Andrews, Hopewell Township, Mercer County, N.J.; Ivan Ladany, Accomack County, Va.

[73] Assignee: General Electric Company, Schenectady, N.Y.

[21] Appl. No.: 115,672

[22] Filed: Nov. 2, 1987

Related U.S. Application Data

[63] Continuation-in-part of Ser. No. 789,461, Oct. 21, 1985, abandoned.

[51] Int. Cl.$^4$ .............................................. H01S 3/19
[52] U.S. Cl. ........................................ 372/96; 372/46
[58] Field of Search ...................... 372/96, 48, 46, 44

[56] References Cited

U.S. PATENT DOCUMENTS

| | | | |
|---|---|---|---|
| 2,854,336 | 9/1958 | Gutknecht | 96/36 |
| 3,669,673 | 6/1972 | Sen et al. | 96/38.3 |
| 3,753,801 | 8/1973 | Lockwood et al. | 148/71 |
| 4,022,932 | 5/1977 | Feng | 427/93 |
| 4,023,993 | 5/1977 | Scifres et al. | 148/172 |
| 4,099,999 | 7/1978 | Burnham et al. | 148/187 |
| 4,251,780 | 2/1971 | Scifres et al. | 331/94.5 |
| 4,302,729 | 11/1981 | Burnham et al. | 331/94.5 |
| 4,359,774 | 11/1982 | Olsen et al. | 372/45 |
| 4,359,776 | 11/1982 | Acket et al. | 372/46 |
| 4,369,513 | 1/1983 | Umeda et al. | 372/46 |
| 4,722,092 | 1/1988 | Liau et al. | 372/96 |
| 4,726,031 | 2/1988 | Wakao et al. | 372/96 |
| 4,745,615 | 5/1988 | Kaneiwa et al. | 372/96 |

FOREIGN PATENT DOCUMENTS

| | | |
|---|---|---|
| 57-75431 | 2/1982 | Japan . |
| 58-220486 | 1/1983 | Japan . |
| 58-219738 | 6/1983 | Japan . |
| 58-97888 | 11/1983 | Japan . |
| 0046081 | 3/1984 | Japan .................... 372/96 |
| 0127892 | 7/1984 | Japan .................... 372/96 |
| 6072284 | 4/1985 | Japan .................... 372/45 |
| 0186083 | 9/1985 | Japan .................... 372/96 |
| 0218191 | 9/1986 | Japan .................... 372/43 |
| 0279192 | 12/1986 | Japan .................... 372/43 |
| 0141795 | 6/1987 | Japan .................... 372/43 |
| 0142384 | 6/1987 | Japan .................... 372/43 |

OTHER PUBLICATIONS

Nakamura et al; "GaAs . . . Feedback"; IEEE J. of Quantum Elec., vol. QE-11, No. 7; 07/1975; pp. 436-439.

Tsang et al; "GaAs . . . Reflectors"; Appl. Phys. Let.; vol. 28, No. 10; 05/15/1976; pp. 596-598.

Tsang et al; "Channeled-Substrate . . . Feedback"; J. Appl. Phys., vol. 50, No. 8; 08/1979; pp. 5165-5167.

Utaka et al; ". . . Lasers with . . . Brag Reflector"; Conference: Integrated and Guided Wave Optics Technical Digest; Jan. 28-30, 1980.

Olsen et al., "InGaAsP Quaternary Alloys: Composition, Refractive Index and Lattice Mismatch", *Journal of Electronic Materials*, vol. 9, No. 6, pp. 977-987 (1980).

Stoll, "Optimally Coupled, GaAs-Distributed Bragg Reflection Lasers", IEEE Transactions on Circuits and Systems, vol. CAS-26, No. 12, Dec. 1979, pp. 1065-1072.

*Primary Examiner*—William L. Sikes
*Assistant Examiner*—Xuan T. Vo
*Attorney, Agent, or Firm*—William Squire; James C. Davis, Jr.; Paul R. Webb, II

[57] ABSTRACT

A distributed feedback laser comprising a semiconductor body having a channel which varies in width in the lateral direction and is periodic in the longitudinal direction. When the laser is electrically excited constructive interference of reflected light gives rise to a stable single wavelength output due to the periodic variations in the channel.

13 Claims, 3 Drawing Sheets

ELECTRO-OPTIC DEVICE HAVING A LATERALLY VARYING REGION

The invention described herein was made in the performance of work under NASA Contract No. NAS 1-17351 and is subject to the provisions of Section 305 of the National Aeronautics and Space Act of 1958 (72 Stat. 435; 42 U.S.C. 2457).

This application is a continuation-in-part of application Ser. No. 789,461, filed Oct. 21, 1985, entitled Distributed Feedback Laser abandoned.

The invention relates to an electro-optic device having an active region which periodically varies in width.

BACKGROUND OF THE INVENTION

A semiconductor laser typically comprises a body of semiconductor material having opposed reflective end faces and having an active layer positioned between two cladding regions of opposite conductivity. Various laser structures have been developed to enhance particular operating characteristics. For example, buried heterostructure (BH) lasers, such as the buried crescent (BC) laser, achieve a low threshold current by index guiding, thus reducing junction temperature rise and consequently allowing higher temperature operation. A BC laser typically comprises a semiconductor body including a substrate having a buffer layer of a first conductivity type, a first blocking layer of a second conductivity type overlying the buffer layer and a second blocking layer of the first conductivity type overlying the first blocking layer. A V-shaped groove is formed through the blocking layers and into the buffer layer in a longitudinal direction, the direction perpendicular to the end faces. A first cladding region of the first conductivity type is positioned in the groove. A semiconductor layer overlies the second blocking layer and is typically discontinuous at the edge of the groove, forming a crescent-shaped active region overlying the first cladding region and having a thickness which varies in the lateral direction, the direction in the plane of the layers and perpendicular to the groove. A second cladding region of the second conductivity type fills the groove and overlies the semiconductor blocking layer. A capping layer of the second conductivity type overlies the second cladding region.

Other lasers such as the distributed feedback (DFB) laser provide a single wavelength output which is stable with temperature, time, output power, and modulation rate. A DFB laser typically comprises an active layer positioned between two planar cladding regions. Periodic corrugations comprising a plurality of elements which are parallel in the lateral direction, are located in the plane of the layers either above or below the active layer. The width of the period between elements determines the wavelength emitted. These corrugations provide spatial variations in the refractive index producing optical feedback thus eliminating the requirement of reflective end faces as in the BH or BC laser.

Combinations of the BH and DFB lasers typically position the active layer such that it overlies the planar DFB grating. It would be desirable to have an alternative laser structure incorporating the characteristics of a BC and DFB laser.

SUMMARY OF THE INVENTION

An electro-optic device which operates at a specific wavelength comprises a body of semiconductor material having an active region positioned between two cladding regions of opposite conductivity. The active region has a sidewall which periodically varies in the lateral direction. The length of each period in the longitudinal direction is about an integral multiple of one-half of the wavelength in the semiconductor body.

BRIEF DESCRIPTION OF THE DRAWING

The features of the invention believed to be novel are set forth with particularity in the appended claims. The invention itself, however, both as to organization and method of operation, together with further objects and advantages thereof, may best be understood by reference to the following description taken in conjunction with the accompanying drawing(s) in which:

DETAILED DESCRIPTION OF THE PREFERRED EMBODIMENTS

Figure 1:
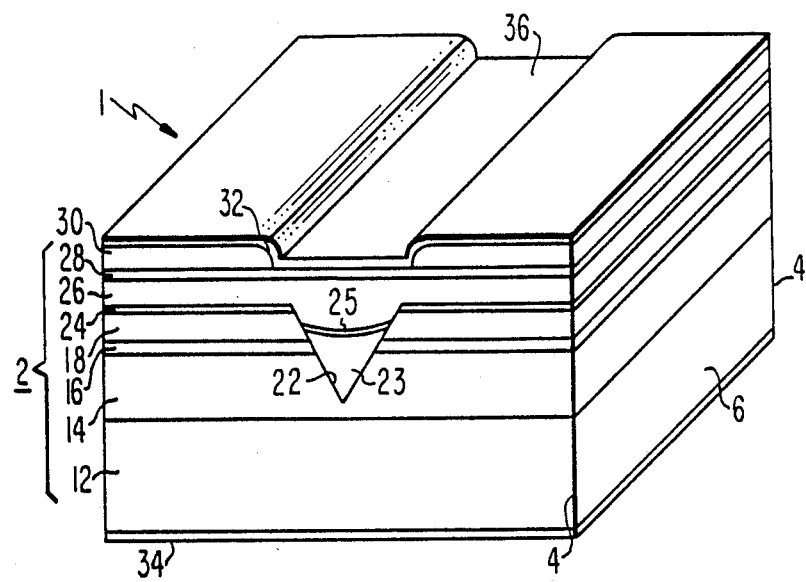
FIG. 1 is a perspective view of an electro-optic of the invention.
Figure 2:
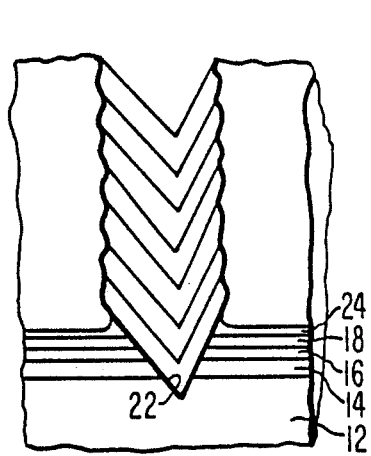
FIGS. 2–5 are partial perspective views of different embodiments of an electro-optic device of the invention.
Figure 3:
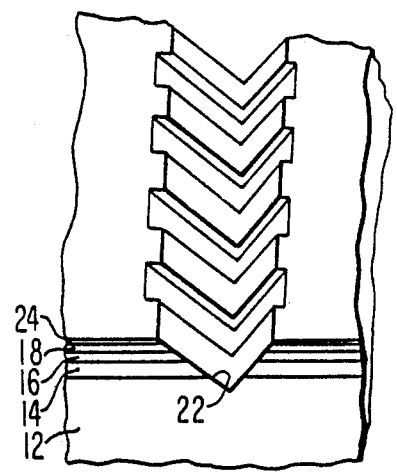

In FIG. 1 a semiconductor laser 1 comprises a body 2 including a pair of parallel end faces 4, at least one of which is partially transparent at the laser wavelength, and sidewalls 6 extending between the end faces 4. The body 2 includes a substrate 12 having a buffer layer 14 thereon, a first blocking layer 16 overlying the buffer layer 14 and second blocking layer 18 overlying the first blocking layer 16. A channel 22 extends in the longitudinal direction through the blocking layers 16 and 18 respectively, and into the buffer layer 14. The channel 22, as shown in FIGS. 2 and 3, varies in width in the lateral direction and is periodic in the longitudinal direction, and includes a first cladding region 23. A semiconductor layer 24, overlies the second blocking layer 18. The semiconductor layer 24 is typically discontinuous at the edge of the channel 22 and forms a crescent shaped active region 25 in the channel 22 overlying the first cladding region 23. A second cladding region 26 fills the channel 22 and overlies the active region 25 and the semiconductor layer 24. A capping layer 28 overlies the second cladding region 26. An electrically insulating layer 30, having an aperture 32 therethrough over the channel 22, overlies the capping layer 28. A means for electrically contacting the semiconductor laser 1 comprises a first electrical contact 34 which overlies the surface of the substrate 12 opposite the buffer layer 14 and a second electrical contact 36 which overlies the capping layer 28 in the aperture 32.

The substrate 12, buffer layer 14, second blocking layer 18, and first cladding region 23 are of one conductivity type and the first blocking layer 16, second cladding region 26 and the capping layer 28 are of the opposite conductivity type. The refractive index of the active region 25 should be greater than the refractive index of both the first and second cladding regions 23 and 26, respectively.

The substrate 12 is typically composed of N-type InP about 250 micrometers (μm) thick and having a first major surface parallel to or slightly misoriented from the (100) crystallographic plane. The buffer layer 14 is typically composed of N-type InP about 3 μm thick. The first blocking layer 16 is typically composed of P-type InP about 0.6 μm thick. The second blocking layer 18 is typically about 2 μm thick and is generally composed of N-type InP. The first cladding region 23 is typically composed of N-type InP. In a V-shaped channel, this region's thickness will determine the width of the active region 25 in the channel 22. The semiconductor layer 24 and active region 25 are typically composed of $In_xGa_{1-x}As_yP_{1-y}$, where x is between about 0.53 and 0.74 and y is about 0.99 and 0.61, depending on the wavelength to be emitted while providing for an approximate lattice match to the buffer layer 14 as disclosed, for example, by Olsen et al. in Journal of Electronic Materials, Vol. 9, No. 6, p. 977 (1980). The semiconductor layer 24 is typically about 0.5 μm thick. The second cladding region 26 is typically composed of P-type InP about 2 μm thick. The capping layer 28 is typically about 0.5 μm thick and is typically composed of P-type $In_rGa_{1-r}As_sP_{1-s}$ where r is about 0.53 and s is about 0.99. The insulating layer 30 is preferably composed of silicon dioxide which is deposited on the capping layer 28 by pyrolytic decomposition of a silicon containing gas such as silane in oxygen or water vapor. The first electrical contact 34 is preferably composed of sequentially deposited germanium, gold, nickel, and gold layers. The second electrical contact 36 is preferably composed of titanium, platinum, and gold layers which are sequentially deposited onto a Zn or Cd diffused surface.

Figure 4:
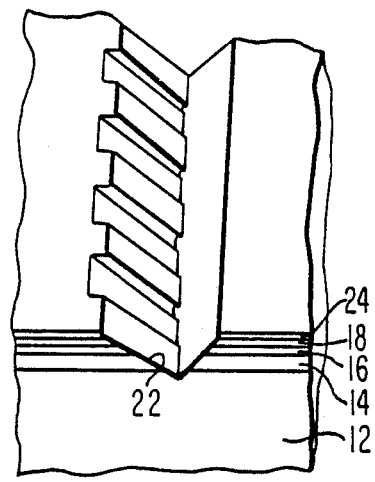

The laser 1 may be fabricated using standard liquid phase epitaxy techniques to deposit the layers and regions. Suitable liquid phase epitaxy techniques have been disclosed by Lockwood et al. in U.S. Pat. No. 3,753,801 incorporated herein by reference. Methods of forming the active region 25 are also well known in the art, as disclosed by Olsen et al. in U.S. Pat. No. 4,359,774, incorporated herein by reference. The active region 25 is crescent shaped in end view and has a thickness that differs in value transverse the longitudinal direction. The channel 22 may be fabricated after the buffer layer 14, and the first and second blocking layers 16 and 18, respectively, have been formed by applying and exposing an electron beam sensitive photoresist and then chemically etching with an etchant such as HCl:H₃PO₄. Preferably, the channel 22 is a V-shaped groove with the sidewalls oriented along the (111)B crystallographic plane and extending in the longitudinal or <011> direction. The channel may have a sinusoidally varying width as in FIG. 2, rectangular variations as in FIG. 3, or other periodic shapes. Additionally, either one or both of the sidewalls of the channel may have spatial variations in the lateral direction which are periodic in the longitudinal direction as shown in FIG. 4.

An alternative method for forming the channel 22, such as disclosed by J. T. Andrews in U.S. patent application (RCA 80,179) entitled "METHOD OF FORMING A VARYING WIDTH CHANNEL", filed concurrently herewith, comprises the steps of first forming a photoresist layer, preferably by spin-coating on the surface of the second blocking layer 18. A periodic grating, having parallel linear photoresist elements extending in the lateral direction, is then formed by exposing the photoresist by standard holographic techniques. A linear opening extending in the longitudinal direction is then formed in the grating by masking, exposing, and developing the photoresist. The photoresist grating is then heated to induce the elements to substantially flow together and to partially extend into the opening such that the opening is bordered by photoresist having a periodically varying pattern. The semiconductor body exposed in the opening is then subjected to a suitable etchant to form a channel having periodically varying sidewalls corresponding to the photoresist pattern.

A third method of fabricating the channel 22 includes forming a holographic grating in the second blocking layer 18 and forming a conformal coating of photoresist thereon. The photoresist is then exposed through a linear striped planar mask such as disclosed by I. Ladany in U.S. patent application (RCA 82,503) entitled "METHOD OF FORMING A CHANNEL", filed concurrently herewith.

The channel should be formed such that the distance between the periodic variations is about an integral multiple of one-half of the wavelength in the semiconductor body as defined by:

$$\Lambda = m (\lambda_0)/(2\eta_e)$$

where $\Lambda$ is the length of the period between variations, $\lambda_0$ is the wavelength of the laser in air, $\eta_e$ is the transverse effective refractive index and m defines the integral multiple of the internal wavelength. Typically, if m is greater than three the laser will not maintain sufficient feedback and thus sacrifice the stability which is desired in the DFB laser. Typically m is about 2 and preferably 1. The channel is typically 2.5 to 3 μm in width in the lateral direction and the amplitude of the periodic variation in width is typically between about 0.05 μm and 0.1 μm.

In the operation of the laser 1, a bias voltage of the proper polarity is applied to the electrical contacts 34 and 36 respectively, producing lasing action in the active region 25. The blocking layers 16 and 18 respectively, provide a means for blocking current flow outside the region of the channel 22 thus focusing the current flow. The lateral variation in the width of the active region 25 in the channel 22 creates constructive interference of reflected light giving rise to a stable single wavelength output.

Although the principles of the invention have been described in relation to a BC laser, it is to be understood that these principles are applicable to other laser devices incorporating alternative materials, thicknesses, layer structures and channel shapes such as rectangular or dove-tail shapes.

Figure 5:
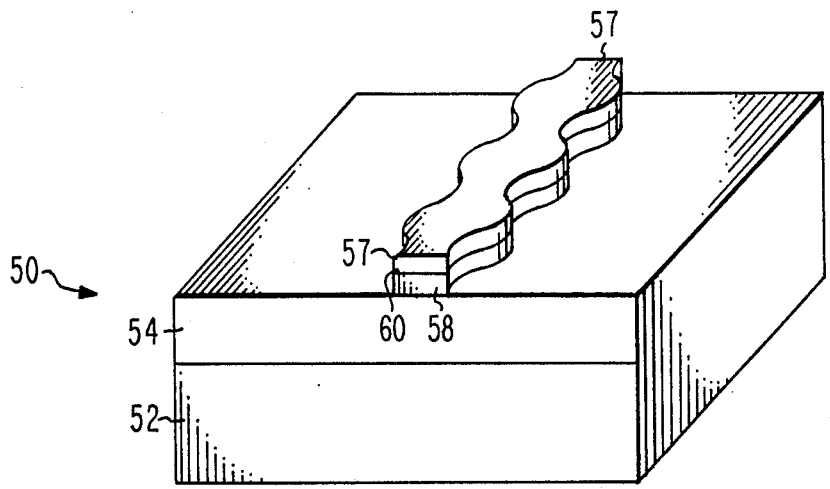
Figure 6:
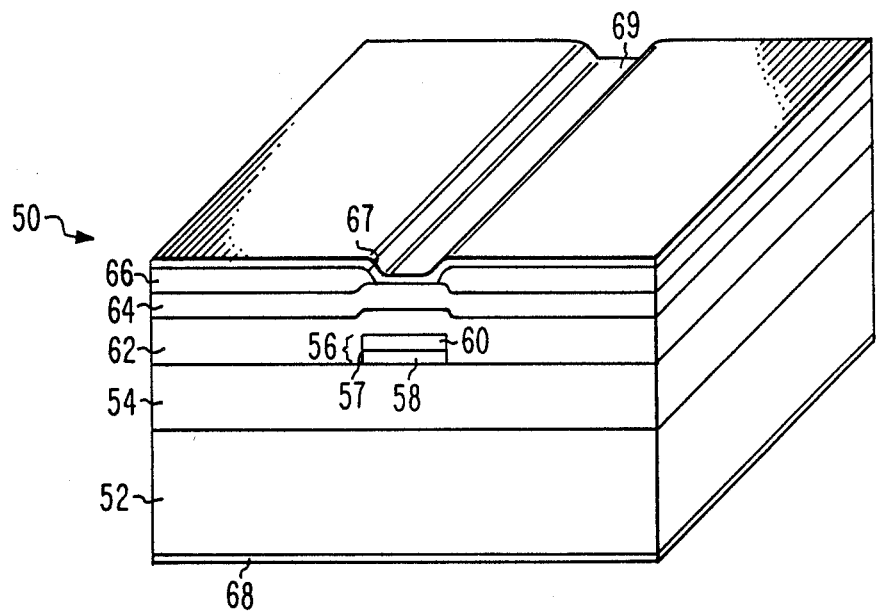

For example, in FIGS. 5 and 6 a ridge guide distributed feedback laser 50 comprises a substrate 52 having a first cladding layer 54 thereon. Overlying the first cladding layer 54 is an active region 56 which has sidewalls 57 which periodically vary in width. The region 56 comprises an active layer 58 and a waveguide layer 60 overlying the active layer. A second cladding layer 62 overlies the first cladding layer 54 and also extends over the active region 56. A capping layer 64 overlies the second cladding layer 62 and an electrically insulating layer 66 having an aperture 67 therethrough over the active region 56 overlies the capping layer 64. A means for electrically contacting the device comprises a first electrical contact 68 which overlies a surface of the substrate 52 opposite the first cladding layer 54 and a second electrical contact 69 which overlies the capping layer 64 in the aperture 67.

Figure 7:
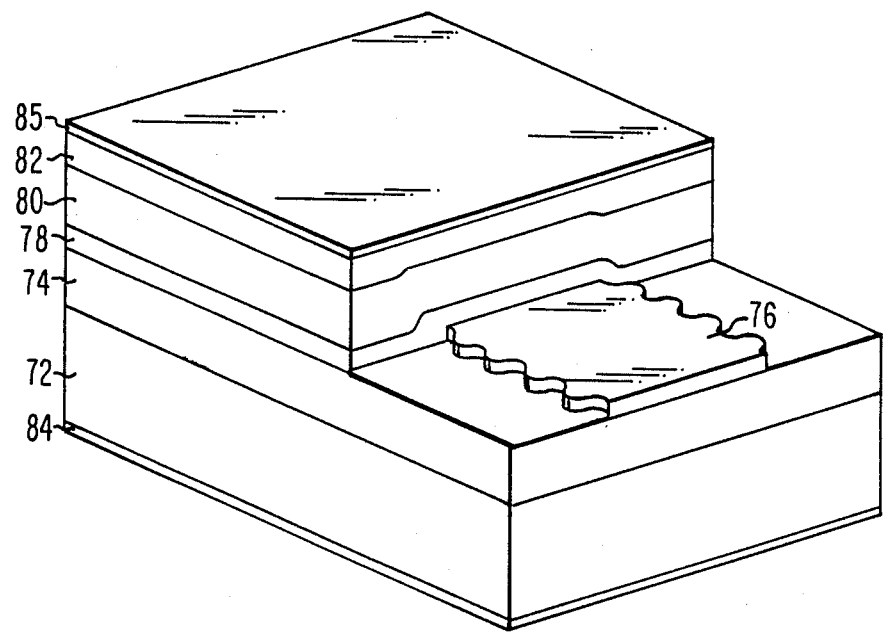
FIGS. 6–7 are prespective views of different embodiments of an electro-optic device of the invention.

Other electro-optic devices may include a Distributed Bragg Reflector (DBR) laser such as depicted in FIG. 7 which comprises a substrate 72, a first cladding layer 74 overlying the substrate 72, an active region 76 such as a waveguide layer overlying the first cladding layer 74 in which a portion of the waveguide region periodically varies in width in the lateral direction. An active layer 78 overlies a portion of the active region 76 such that the portion of the active region 76 which periodically varies in width is external to the light producing cavity of the laser. A second cladding layer 80 overlies the active layer 78 and a capping layer 82 overlies the second cladding layer 80. A means for electrically contacting the device comprises a first electrical contact 84 which overlies a surface of the substrate 72 opposite the first cladding layer 74 and a second electrical contact 85 which overlies the capping layer 82.

These embodiments provide advantages over prior art structures by providing increased coupling with two gratings. Therefore, a smaller intersection length is required. Further, the use of two gratings provides increased wavelength discrimination, which is induced by a phase shift between the gratings formed on each of two sidewalls of the cavity.

While only certain preferred features of the invention have been illustrated and described herein, many modifications and changes will occur to those skilled in the art. It is, therefore, to be understood that the appended claims are intended to cover all such modifications and changes as fall within the true spirit of the invention.

We claim:

1. A distributed feedback laser comprising a semiconductor body having a pair of opposed end faces, at least one of which is partially transparent at the laser wavelength, said body having an active region positioned between first and second cladding regions of opposite conductivity type, wherein the improvement comprises:
    a channel defined by a pair of spaced sidewalls, said channel extending in a longitudinal direction between the end faces and periodically varying in width in the lateral direction with each period in the longitudinal direction being about an integral multiple of one half of said wavelength in the semiconductor body, said first cladding region and said active region lying within said channel and abutting said sidewalls whereby said active region periodically varies in said width in said lateral direction in periods which are in said integral multiple; and
    electrical contact means coupled to said first and second cladding regions.

2. The laser of claim 1, wherein the channel width is sinusoidally varying.

3. The laser of claim 1, wherein the channel width is rectangularly varying.

4. The laser of claim 1, wherein the second cladding region is partially positioned in said channel.

5. The laser of claim 1, wherein said channel is V-shaped.

6. A distributed feedback laser, having opposed end faces, at least one of which is partially transparent at the laser wavelength, said laser comprising:
    a substrate having a major surface;
    means for blocking current flow overlying said major surface of said substrate;
    a channel defined by a pair of sidewalls extending between and to the end faces in a longitudinal direction and extending through said means for blocking current flow in a first transverse direction normal to said longitudinal direction, said channel periodically varying in width in a second transverse direction normal to said first and longitudinal directions with each period in the longitudinal direction being about an integral multiple of one half of the wavelength in the semiconductor body;
    a first cladding region abutting said sidewalls partially filling the channel;
    an active region within said channel in contact with said sidewalls and overlying the first cladding region;
    a second cladding region overlying the active region; and
    means for applying current to said substrate and said second cladding region.

7. The laser of claim 6, wherein said channel is a V-shaped groove.

8. The laser of claim 6, wherein said active region is crescent shaped in end view and of different thicknesses in said first transverse direction.

9. The laser of claim 6, wherein said means for blocking current flow comprises a first blocking layer of one conductivity type and a second blocking layer of an opposite conductivity type overlying said first blocking layer.

10. The laser of claim 6, wherein a buffer layer is interposed between said substrate and said means for blocking current flow.

11. The laser of claim 6, wherein the amplitude of the periodic variation in width is between about 0.05 and 0.1 micrometer.

12. The laser of claim 6, wherein the width of the channel is between about 2.5 and 3.0 micrometers.

13. In a semiconductor laser device the combination comprising:
    a first semiconductor body having a given length and a given conductivity;
    a second semiconductor body of a length smaller than said given length and a conductivity opposite to the conductivity of the first body;
    an active layer between said first and second bodies and having a portion extending in a longitudinal direction beyond the second body and overlying the first body to form an external layer portion, said layer having a transverse width normal to said longitudinal direction, said active layer being defined by a pair of opposed longitudinal sidewalls, at least one of the sidewalls of said external portion periodically undulating to form said active external layer with a transverse width that periodically varies in amplitude; and
    electrical contact means connected to said first and second bodies.

* * * * *